US007498959B2

(12) United States Patent
Lee et al.

(10) Patent No.: US 7,498,959 B2
(45) Date of Patent: Mar. 3, 2009

(54) APPARATUS AND METHOD OF WIDEBAND DECODING TO SYNTHESIZE A DECODED EXCITATION SIGNAL WITH A GENERATED HIGH FREQUENCY BAND SIGNAL

(75) Inventors: Kang-eun Lee, Yongin-si (KR); Eun-mi Oh, Yongin-si (KR); Ho-sang Sung, Yongin-si (KR); Chang-yong Son, Yongin-si (KR); Ki-hyun Choo, Yongin-si (KR); Jung-hoe Kim, Yongin-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 11/766,322

(22) Filed: Jun. 21, 2007

(65) Prior Publication Data

US 2007/0296614 A1 Dec. 27, 2007

(30) Foreign Application Priority Data

Jun. 21, 2006 (KR) ..................... 10-2006-0056073

(51) Int. Cl.
*H03M 7/12* (2006.01)

(52) U.S. Cl. ......................... 341/70; 704/262; 704/229

(58) Field of Classification Search ............. 341/60–90
See application file for complete search history.

(56) References Cited

U.S. PATENT DOCUMENTS 6,654,718 B1 * 11/2003 Maeda et al. ............... 704/229
6,658,378 B1 * 12/2003 Maeda .................... 704/200.1

* cited by examiner

*Primary Examiner*—Lam T Mai
(74) *Attorney, Agent, or Firm*—Stanzione & Kim, LLP

(57) ABSTRACT

Encoding and/or decoding a wideband signal produces high frequency band spectra from low frequency band spectral information. Linear prediction filter coefficients are determined for the entire wideband spectrum of an input signal. An energy value in each of a plurality of sub-bands in the high frequency band is determined and encoded. The short-term correlation removed input signal is then down-sampled to form a low frequency band signal. At a decoder, the high frequency band signal is generated using the encoded low frequency band signal. The energy in each sub-band of the high frequency band is adjusted using the encoded energy value. Thus, the spectral envelope for the entire wideband signal is synthesized and decoded using linear predictive synthesis.

12 Claims, 7 Drawing Sheets

APPARATUS AND METHOD OF WIDEBAND DECODING TO SYNTHESIZE A DECODED EXCITATION SIGNAL WITH A GENERATED HIGH FREQUENCY BAND SIGNAL

CROSS-REFERENCE TO RELATED APPLICATIONS

This application claims the benefit of priority under 35 U.S.C. § 119(a) of Korean Patent Application No. 10-2006-0056073, filed on Jun. 21, 2006, in the Korean Intellectual Property Office, the disclosure of which is incorporated herein by reference in its entirety.

BACKGROUND OF THE INVENTION

1. Field of the Invention

The present general inventive concept relates to encoding and/or decoding a wideband signal, and more particularly, to a method and an apparatus to encode and/or decode a high frequency band signal using a low frequency band signal.

2. Description of the Related Art

According to ITU-T G.772.2 recommendation (hereinafter, the "G.772.2 specification"), which is widely followed in the field of speech transmission, 16 kHZ wideband speech signals are down-sampled to 12.9 kHz and then encoded to reduce the number of bits used for representing the input signals. The encoders in a G.772.2 compliant system perform linear predictions that do not allocate bits to encode voice information spectrally located in high frequency bands.

Accordingly, decoders use comfort noises to perform up-sampling so as to generate high frequency bands that were excluded through down-sampling at the encoder. However, these signals are artificially generated by the decoders and do not correspond to the high frequency components of the original signals. Thus, a spectral envelope different from the envelope of the original signal is generated. As a result, the quality of the reproduced speech is diminished.

SUMMARY OF THE INVENTION

The present general inventive concept provides a method and an apparatus to perform a linear prediction on an input signal, encoding an energy value in each sub-band of a high frequency band, and down-sampling the input signal to encode the input signal.

The present general inventive concept invention also provides a method and an apparatus to generate a high frequency band signal using a low frequency band signal and synthesizing the spectral envelope of the full frequency spectrum of a recovered excitation signal.

Additional aspects and utilities of the present general inventive concept will be set forth in part in the description which follows and, in part, will be obvious from the description, or may be learned by practice of the general inventive concept.

The foregoing and/or additional aspects and utilities of the present general inventive concept may be achieved by providing a wideband encoding method including performing a linear prediction on an input signal to generate an excitation signal, down-sampling the excitation signal to a pre-set frequency; and encoding the down-sampled signal.

The foregoing and/or additional aspects and utilities of the present general inventive concept may also be achieved by providing a wideband decoding method including decoding an excitation signal, up-sampling the decoded signal, generating a high frequency band signal of the up-sampled signal using the decoded excitation signal, and decoding linear predictive coding (LPC) coefficients to LPC synthesize the decoded excitation signal with the generated high frequency band signal.

The foregoing and/or additional aspects and utilities of the present general inventive concept may also be achieved by providing a method of generating a high frequency band, including folding a low frequency band signal over a high frequency band signal, and decoding an energy value corresponding to each sub-band of the high frequency band and to adjust the folded signal therewith.

The foregoing and/or additional aspects and utilities of the present general inventive concept may also be achieved by providing a computer-readable medium having embodied thereon processor instructions to execute the wideband encoding method.

The foregoing and/or additional aspects and utilities of the present general inventive concept may also be achieved by providing a computer-readable medium having embodied thereon processor instructions to execute the wideband decoding method.

The foregoing and/or additional aspects and utilities of the present general inventive concept may also be achieved by providing a computer-readable medium having embodied thereon processor instructions to execute the method of generating the high frequency band.

The foregoing and/or additional aspects and utilities of the present general inventive concept may also be achieved by providing a wideband encoding apparatus including a linear predictor to perform a linear prediction on an input signal to generate an excitation signal, a down-sampler to down-sample the excitation signal to a pre-set frequency, and an excitation signal encoder to encode the down-sampled excitation signal.

The foregoing and/or additional aspects and utilities of the present general inventive concept may also be achieved by providing a wideband decoding apparatus including an excitation signal decoder to decode an excitation signal, an up-sampler to up-sample the decoded signal, a high frequency band generator to generate a high frequency band signal of the up-sampled signal using the decoded excitation signal, and an synthesizer to decode LPC coefficients to LPC synthesize the decoded signal with the generated high frequency band signal.

The foregoing and/or additional aspects and utilities of the present general inventive concept may also be achieved by providing an apparatus for generating a high frequency band, including a folder to fold a low frequency band signal over a frequency signal, and a high frequency band adjuster to decode an energy value in each sub-band of a high frequency band and to adjust the folded signal therewith.

The foregoing and/or additional aspects and utilities of the present general inventive concept may also be achieved by providing a method of conveying a signal across a transmission channel including determining a spectral envelope representation of a full spectrum of the signal, determining an excitation signal representation of a frequency band of the signal less than a preset frequency, transmitting the spectral envelope representation and the excitation signal representation over the transmission channel, receiving the spectral envelope representation and the excitation signal representation from the transmission channel, recovering an excitation signal from the received excitation signal representation, a spectrum of the excitation signal being less than the preset frequency, transferring characteristics of the recovered excitation signal less than another preset frequency to a band of frequencies greater than the other preset frequency, adjusting at least one of the characteristics of the excitation signal above the other preset frequency in accordance with the received spectral envelope representation of the signal, and recovering the full spectrum of the signal from the adjusted excitation signal and the received spectral envelope representation of the full spectrum of the signal.

The foregoing and/or additional aspects and utilities of the present general inventive concept may also be achieved by providing a system to communicate a signal over a transmission channel including an encoder to determine a spectral envelope representation of a full spectrum of the signal and to determine an excitation signal representation of a frequency band of the signal less than a preset frequency, a transmitter to transmit a bitstream including the spectral envelope representation and the excitation signal representation, a receiver to receive the bitstream, and a decoder to decode the spectral envelope representation and the excitation signal representation and to recover the signal therefrom.

The foregoing and/or additional aspects and utilities of the present general inventive concept may also be achieved by providing a wideband encoding apparatus including a linear predictor to obtain linear prediction coefficients for a full spectrum of a signal predictor and to remove a short-term correlation component of the signal subsequent thereto to produce an excitation signal thereby, and an excitation signal encoder to determine an excitation signal representation of a frequency band of the excitation signal only below a preset frequency.

The foregoing and/or additional aspects and utilities of the present general inventive concept may also be achieved by providing a wideband encoding apparatus including a high frequency band generator to generate a full spectrum excitation signal from a representation of a frequency band of an excitation signal below a preset frequency and energy values of the excitation signal above the preset frequency, and a linear prediction synthesizer to synthesize a wideband signal from the generated full spectrum excitation signal and linear prediction coefficients corresponding to a full spectrum excitation signal from which the representation thereof and the energy values thereof are derived.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
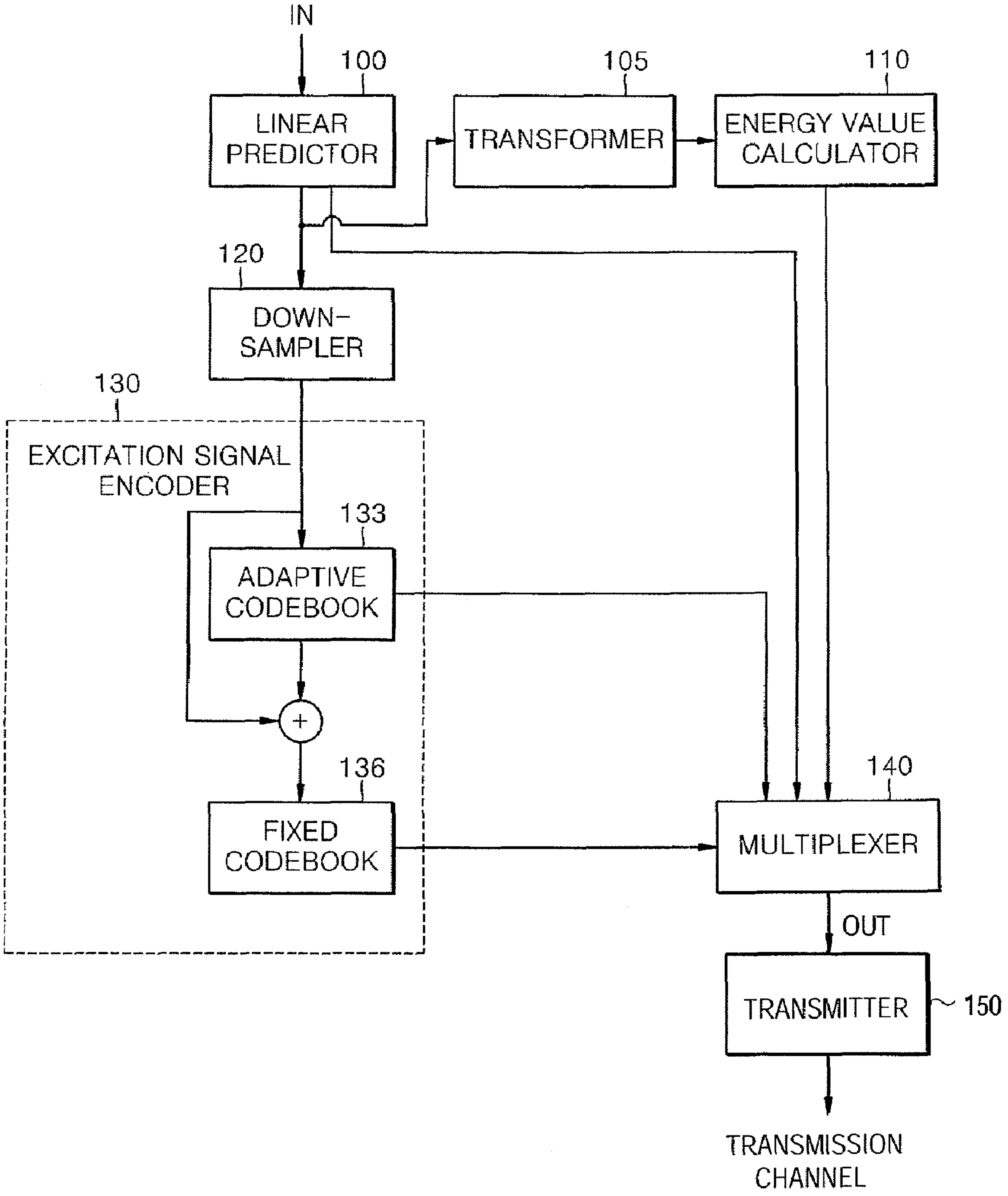
FIG. 1 is a block diagram illustrating a wideband encoding apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a block diagram illustrating a wideband encoding apparatus according to an embodiment of the present general inventive concept. Referring to FIG. 1, the exemplary wideband encoding apparatus includes a linear predictor 100, a transformer 105, an energy value calculator 110, a down-sampler 120, an excitation signal encoder 130, and a multiplexer 140. It is to be understood that the exemplary configuration of components illustrated in FIG. 1 is provided to describe various functional features of the present general inventive concept. Other configurations are within the intended scope of the present general inventive concept in which functionality is combined in a single component or is distributed among alternative components. It is to be further understood that the exemplary system of FIG. 1 may be implemented in hardware, software or a combination of both. For example, the present general inventive concept may be practiced through processor instructions executed on a suitable processor. The processor instructions may be derived from a programming language to embody certain processes described below.

The exemplary linear predictor 100 receives an input signal, such as a digitized speech signal, through an input port IN, and performs a linear predictive coding (LPC) analysis on the input signal to extract LPC coefficients. The linear predictor 100 then removes a short-term correlation component from the input signal to generate an excitation signal. The linear predictor 100 extracts LPC coefficients representing the spectral envelope of the full spectrum of the speech signal, i.e., before the down-sampler 120 performs down-sampling, so as to capture spectral envelope information of the high frequency band of the original signal for subsequent recovery at a decoder. Thus, spectral envelope representation for both low and high frequency bands are available to recover a full spectral envelope.

The exemplary transformer 105 transforms the excitation signal generated by the linear predictor 100 into a frequency domain representation thereof using, for example, a Fast Fourier Transform (FFT).

The exemplary energy value calculator 110 calculates an energy value in each of a plurality of sub-bands of the high frequency band of the excitation signal, which has been transformed into the frequency domain by the transformer 105. In certain embodiments of the general inventive concept, the high frequency band contains the frequency components of the excitation signal greater than a pre-set frequency w kHz.

Figure 7:
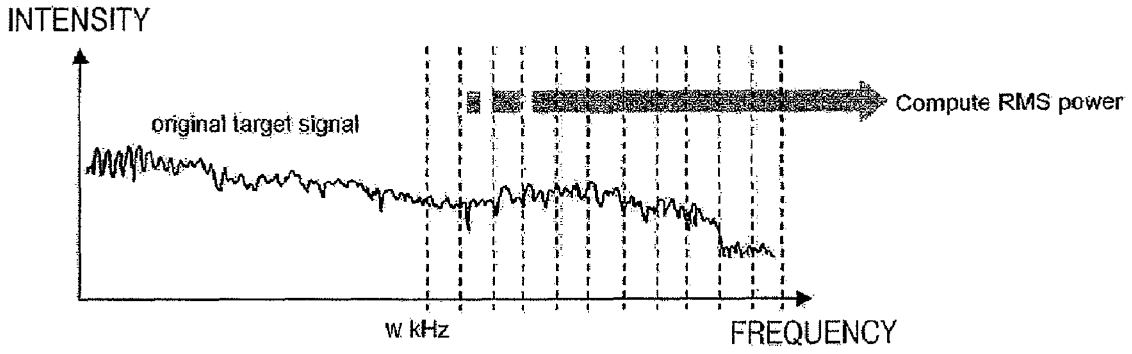
FIG. 7 is a graph illustrating each band of a high frequency band using the wideband encoding method and apparatus, according to an embodiment of the present general inventive concept.

The energy value calculator 110 calculates RMS energy $e_j$ in the $j^{th}$ sub-band, as illustrated in FIG. 7, using, for example, Equation 1 below:

$$e_j = \sqrt{\frac{1}{N_j}\sum_{i=0}^{N_j-1} f_i^2}, \quad \text{Equation (1)}$$

wherein $f_i$ denotes the spectral value of the $i^{th}$ frequency bin of the $j^{th}$ sub-band, and $N_j$ denotes the number of frequency bins of the $j^{th}$ sub-band.

The energy value calculator 110 may quantize an RMS power vector $E_j$ into which the RMS energy $e_j$ is transformed in a log scale using, for example, Equation 2 below, using vector quantization. The energy value calculator 110 then may output an index of the quantized RMS power vector $E_j$ to the multiplexer 140.

$$E_j=10\log_{10}(e_j+1). \quad \text{Equation (2)}$$

The exemplary down-sampler 120 down-samples the excitation signal generated by the linear predictor 100 to w kHz, where w is the cutoff frequency of the down-sampled excitation signal. For example, in accordance with G.722.2 standards, the down-sampler 120 down-samples the excitation signal from 16 kHz to 12.9 kHz, where the cutoff frequency of the excitation signal is w=12.9 kHz.

Down-sampling the excitation signal improves the efficiency of code excited linear prediction (CELP) coding, which, in certain embodiments of the general inventive concept, is the basis of subsequent processing of the speech signal. First, the excitation signal is encoded to a narrower frequency bandwidth so as to minutely express the low frequency. Further, since the number of samples in a frame of speech is reduced by down-sampling, the computational complexity of the process is reduced.

The exemplary excitation signal encoder 130 encodes the excitation signal down-sampled by the down-sampler 120. In certain embodiments of the present general inventive concept, the excitation signal encoder 130 includes an adaptive codebook 133 and a fixed codebook 136. The adaptive codebook 133 and the fixed codebook may be implemented in accordance with CELP or other equivalent processes to achieve the encoding of the excitation signal.

The exemplary adaptive codebook 133 is searched and an adaptive codebook index corresponding to the excitation signal down-sampled by the down-sampler 120 is provided at the output the adaptive codebook 133. The adaptive codebook index is provided to an exemplary multiplexer 140.

The exemplary fixed codebook 136 is searched and a fixed codebook index corresponding to the adaptive codebook index of the excitation signal is provided at the output of the fixed codebook 136. The fixed codebook index is provided to multiplexer 140.

The multiplexer 140 generates a bitstream including the LPC coefficients output from the linear predictor 100, the index output from the energy value calculator 110, the adaptive codebook index output from the adaptive codebook 133, and the fixed codebook index output from the fixed codebook 136 and outputs the bitstream through an output port OUT.

The exemplary transmitter 150 may be provided at the output of the encoder to format suitable signals representative of the bitstream for transmission across a transmission channel. The present general inventive concept is not limited to any type of transmitter or medium of the transmission channel, and the implementation details of the transmitter 150 will be omitted for purposes of brevity.

Figure 2:
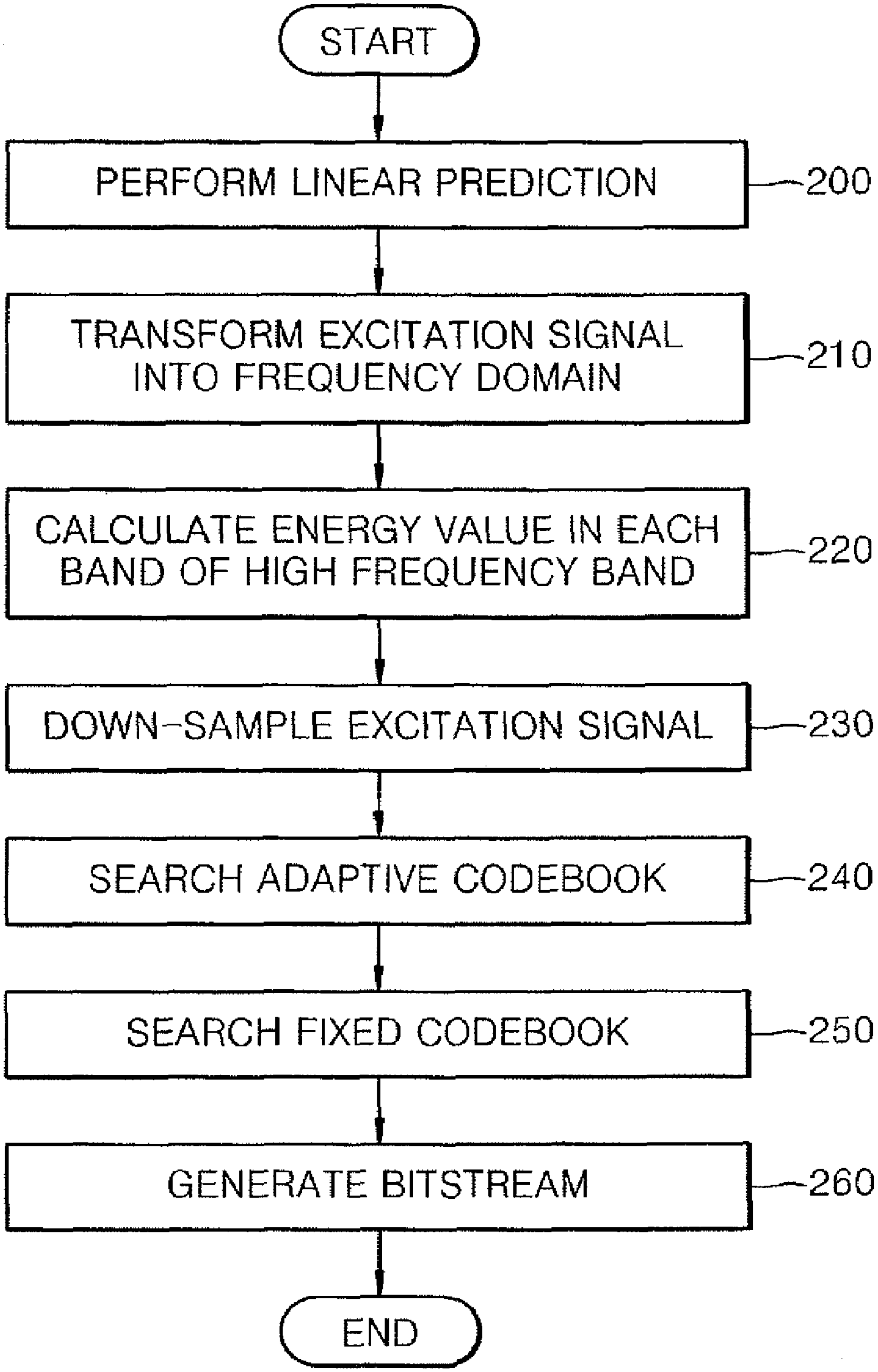
FIG. 2 is a flowchart illustrating a wideband encoding method according to an embodiment of the present general inventive concept.

FIG. 2 is a flowchart illustrating a wideband encoding method according to an embodiment of the present general inventive concept.

In operation 200, an LPC analysis is performed on an input signal to extract LPC coefficients, and a short-term correlation component is removed from the input signal to generate an excitation signal. In other words, in operation 200, LPC coefficients for the entire spectral envelope are extracted before the excitation signal is down-sampled in operation 230, so as to recover envelope information that includes the high frequency band of the original signal when a decoder decodes the speech signal. Consequently, envelopes of both low and high frequency bands may be recovered to reproduce the entire spectral envelope.

In operation 210, the excitation signal is transformed into a frequency domain representation using, for example, an FFT.

In operation 220, an energy value is calculated for each sub-band of the high frequency band of the excitation signal, which has been transformed into the frequency domain in operation 210. In certain embodiments of the present general inventive concept, the high frequency band encompasses frequencies greater than a pre-set frequency w kHz.

RMS energy $e_j$ of the $j^{th}$ sub-band of the high frequency band, as illustrated in FIG. 7, is calculated in operation 220 using, for example, Equation 3 below:

$$e_j = \sqrt{\frac{1}{N_j}\sum_{i=0}^{N_j-1} f_i^2} \quad \text{Equation (3)}$$

wherein $f_i$ denotes the spectral value in the $i^{th}$ frequency bin of the $j^{th}$ sub-band, and $N_j$ denotes a number of frequency bins of the $j^{th}$ sub-band.

In operation 220, an RMS power vector $E_j$, into which the RMS energy $e_j$ is transformed in a log scale using, for example, Equation 4 below, is quantized using vector quantization. A power vector index of the quantized RMS power vector $E_j$ is output.

$$E_j=10\log_{10}(e_j+1) \quad \text{Equation (4)}$$

In operation 230, the excitation signal generated in operation 220 is down-sampled to w kHz. For example, in accordance with G.722.2 standards, the excitation signal is down-sampled from 16 kHz to w=12.9 kHz.

In operation 240, an adaptive codebook index corresponding to the excitation signal down-sampled in operation 230 is searched from an adaptive codebook and the adaptive codebook index is output.

In operation 250, a fixed codebook index corresponding to the adaptive codebook index of the excitation signal is searched from a fixed codebook and the fixed codebook index is output.

In operation 260, a bitstream is generated that includes the LPC coefficients output in operation 200, the power vector index output in operation 220, the adaptive codebook index output in operation 240, and the fixed codebook index output in operation 250.

Figure 3:
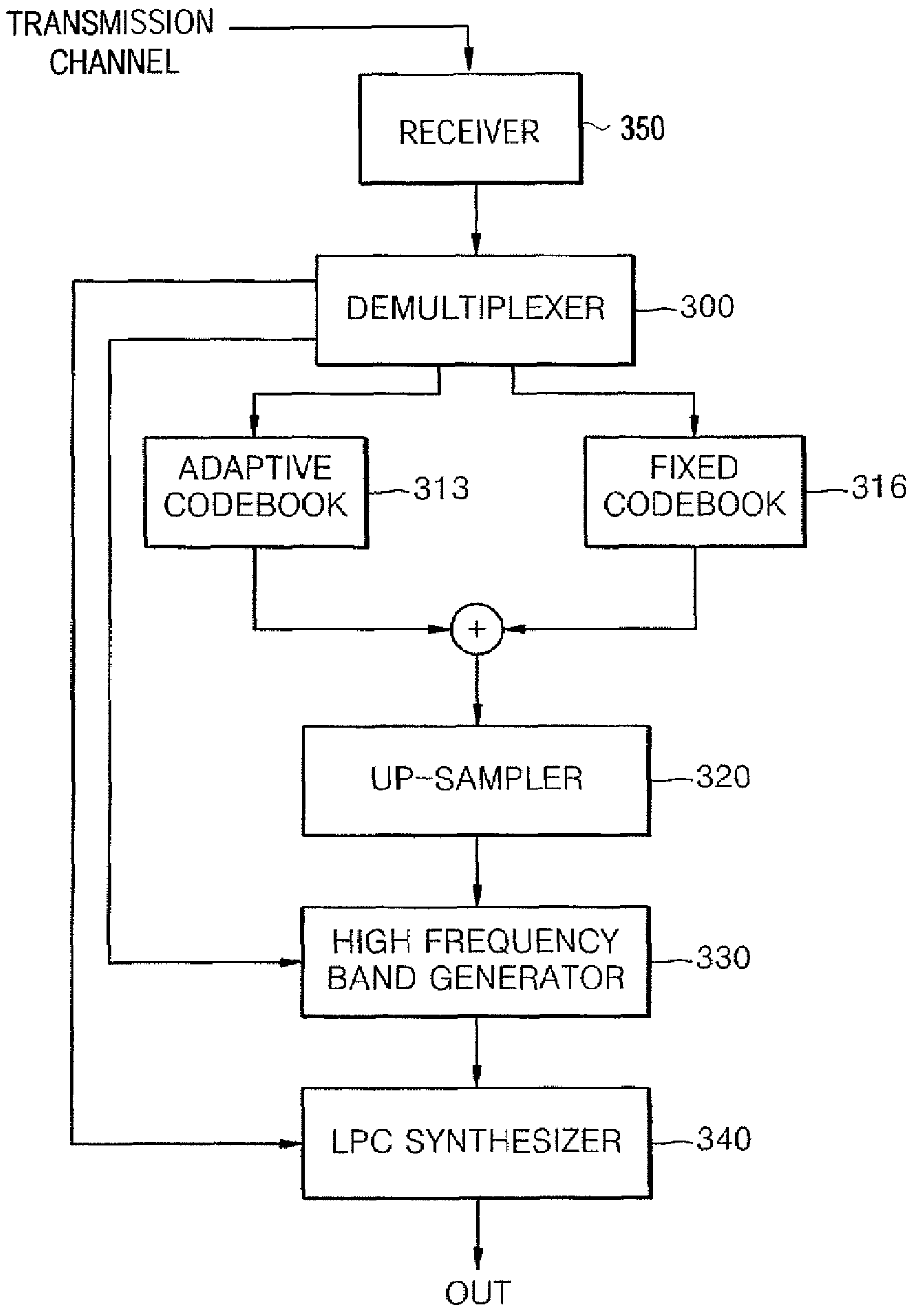
FIG. 3 is a block diagram illustrating a wideband decoding apparatus according to an embodiment of the present general inventive concept.

FIG. 3 is a block diagram illustrating a wideband decoding apparatus according to an embodiment of the present invention. Referring to FIG. 3, the exemplary wideband decoding apparatus includes a demultiplexer 300, an adaptive codebook 313, a fixed codebook 316, an up-sampler 320, a high frequency band generator 330, and an LPC synthesizer 340. It is to be understood that the exemplary configuration of components illustrated in FIG. 3 is provided to describe various functional features of the present general inventive concept and that other configurations are within the intended scope of the present general inventive concept. Such other configurations include those in which functionality is combined in a single component or is distributed among alternative components. It is to be further understood that the exemplary system of FIG. 3 may be implemented in hardware, software or a combination of both.

A receiver 350 may be provided at the input of the decoding apparatus to receive an encoded bitstream from the transmission channel and to reformat the bitstream into a format suitable for the decoder implementation. The present general inventive concept is not limited to any specific receiver type, and the implementation details of the receiver 350 will be omitted for purposes of brevity.

The exemplary demultiplexer 300 receives the bitstream at an input port IN and extracts the information encoded on the bitstream. In accordance with certain embodiments of the present general inventive concept, the demultiplexer 300 outputs an adaptive codebook index to the adaptive codebook 313, a fixed codebook index to the fixed codebook 316, an power vector index corresponding to an energy value in each sub-band of a high frequency band to the high frequency band generator 330, and LPC coefficients to the LPC synthesizer 340.

The exemplary adaptive codebook 313 outputs a signal corresponding to the adaptive codebook index output from the demultiplexer 300.

The exemplary fixed codebook 316 outputs a signal corresponding to the fixed codebook index output from the demultiplexer 300. As described above with regard to the encoding apparatus, the adaptive codebook and the fixed codebook may be realized by an implementation of CLEP, or other suitable decoding process complementary to the encoding process of the excitation signal.

The exemplary up-sampler 320 up-samples the summation of the signal output from the adaptive codebook 313 and the signal output from the fixed codebook 316. Since the signal produced by the summed signals of the adaptive codebook 313 and the fixed codebook 316 correspond to the excitation signal down-sampled to w kHz in the encoder, the up-sampler 320 may produce a signal having a frequency component that was not considered at the encoder end. Hereinafter, a band of frequencies below or equal to w kHz is referred to as a low frequency band, and a band of frequencies above w kHz is referred to as a high frequency band.

The exemplary high frequency band generator 330 generates a high frequency band signal for the high frequency band of the signal up-sampled by the up-sampler 320 using a low frequency band signal that is the signal decoded by the adaptive codebook 313 and the fixed codebook 316. The high frequency band generator 330 may adjust the high frequency band signal using the power vector index corresponding to the energy value in each sub-band of the high frequency band output from the demultiplexer 300.

The exemplary LPC synthesizer 340 performs LPC synthesis on the full spectrum excitation signal generated by the high frequency band generator 330 using the LPC coefficients output from the demultiplexer 300. The LPC synthesizer 340 outputs the synthesized signal at an output port OUT.

Figure 4:
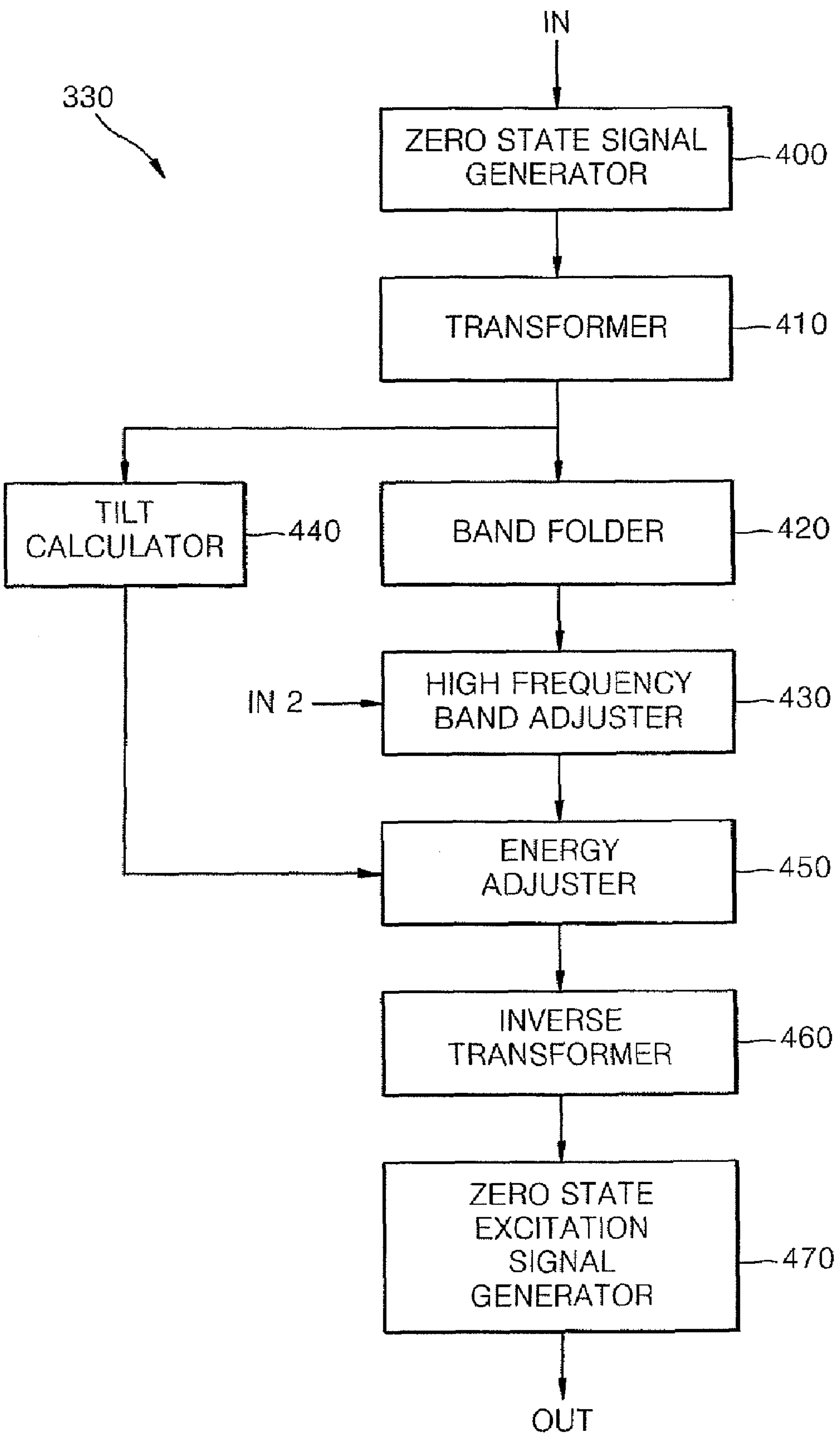
FIG. 4 is a block diagram illustrating a high frequency band generator 330 of the wideband decoding apparatus illustrated in FIG. 3, according to an embodiment of the present general inventive concept.

FIG. 4 is a block diagram illustrating an example of the high frequency band generator 330 of the wideband decoding apparatus illustrated in FIG. 3, according to an embodiment of the present general inventive concept. The high frequency band generator 300 according to the embodiment of FIG. 4 includes a zero state signal generator 400, a transformer 410, a band folder 420, a high frequency band adjuster 430, a tilt calculator 440, an energy adjuster 450, an inverse transformer 460, and a zero state excitation signal generator 470. As with the other system configurations above, it is to be understood that the exemplary configuration of components illustrated in FIG. 4 is provided to describe various functional features of the present general inventive concept, and that other configurations are within the intended scope of the present general inventive concept. Such other configurations include those in which functionality is combined in a single component or is distributed among alternative components. It is to be further understood that the exemplary system of FIG. 4 may be implemented in hardware, software or a combination of both.

The exemplary zero state signal generator 400 performs impulse response and convolution of an LPC synthesis filter on the excitation signal up-sampled by the up-sampler 320 to generate a zero state signal.

The exemplary transformer 410 transforms the zero state signal generated by the zero state signal generator 400 into the frequency domain, such as through an FFT.

Figure 8:
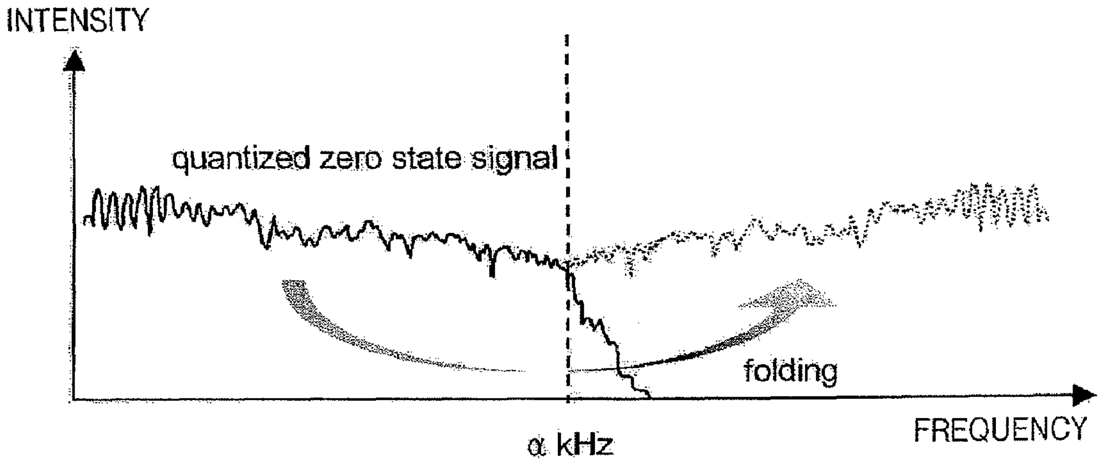
FIG. 8 is a graph illustrating a low frequency band signal folded over a high frequency band signal in exemplary operation S620 performed by a band folder 420 of the exemplary wideband encoding apparatus illustrated in FIG. 3, according to an embodiment of the present general inventive concept.

The exemplary band folder 420 symmetrically folds the low frequency band signal, which has been transformed into the frequency domain by the transformer, over a high frequency band based on a kHz (where a denotes a frequency obtained through a division of w by "2") as illustrated in FIG. 8. The low frequency band signal is folded over into the high frequency band to generate a high frequency band signal having excitation signal characteristics consistent with the original signal.

Figure 9:
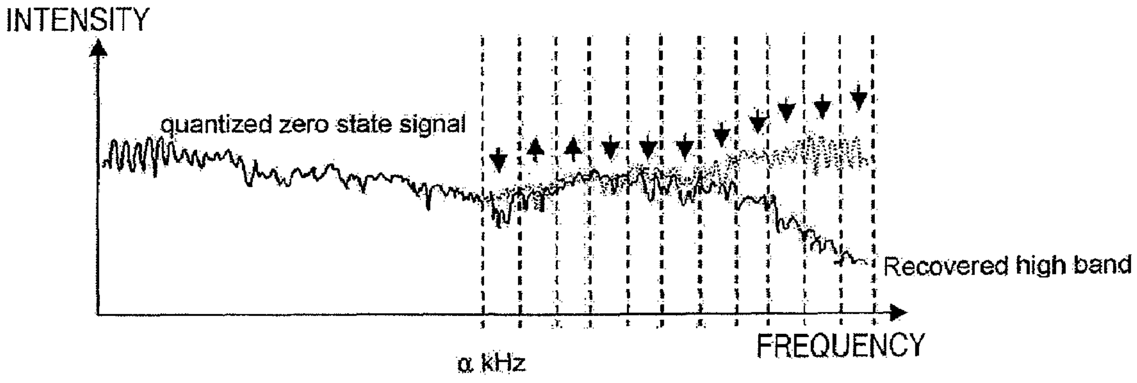
FIG. 9 is a graph illustrating a high frequency band signal adjusted in exemplary operation S630 performed by a high frequency band adjuster 430 of the exemplary wideband encoding apparatus illustrated in FIG. 1, according to an embodiment of the present general inventive concept.

The exemplary high frequency band adjuster 430 adjusts the high frequency band signal as illustrated in FIG. 9 using the power vector index corresponding to the energy value in each sub-band of the high frequency band output from the demultiplexer 300. In certain embodiments of the present general inventive concept, the high frequency band adjuster 430 adjusts a spectral value of every frequency in each corresponding sub-band using the energy value previously computed for that sub-band.

The exemplary tilt calculator 440 determines a spectral envelope tilt of the low frequency band signal which has been transformed into the frequency domain by the transformer 410.

The exemplary energy adjuster 440 adjusts an energy intensity f in the sub-bands of the high frequency band using the envelope tilt calculated by the tilt calculator 440. The energy adjuster 440 adjusts the high frequency band using spectral envelope tilt information of the low frequency band so that the frequency components of the low frequency band are continuous with the frequency components of the high frequency band generated by the high frequency band generator 330.

The exemplary inverse transformer 460 transforms the signal adjusted by the energy adjuster 440 into a time domain signal, such as through an inverse FFT.

The exemplary zero state excitation signal generator 470 performs impulse response computation and convolution with an LPC analysis filter to generate a zero state excitation signal.

Figure 5:
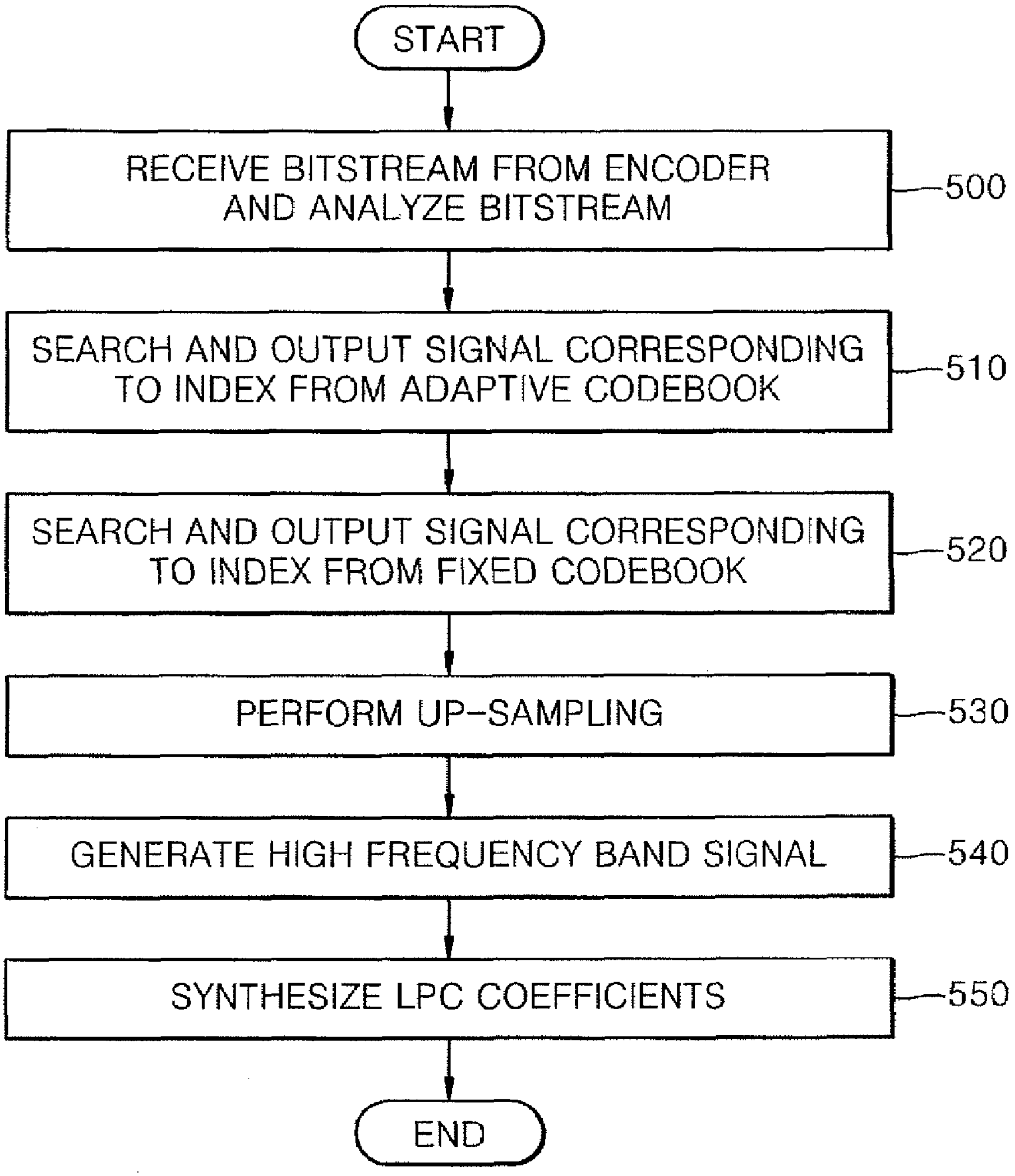
FIG. 5 is a flowchart illustrating a wideband decoding method according to an embodiment of the present general inventive concept.

FIG. 5 is a flowchart illustrating a wideband decoding method according to an embodiment of the present general inventive concept.

In operation 500, an encoded bitstream is received and analyzed. In other words, in operation 500, the bitstream is analyzed to extract therefrom encoded information, such as an adaptive codebook index, a fixed codebook index, an power vector index corresponding to an energy value in each sub-band of the high frequency band, and LPC coefficients.

In operation 510, the adaptive codebook is searched for the adaptive codebook index and a signal corresponding thereto is then output.

In operation 520, the fixed codebook is searched for the fixed codebook index and a signal corresponding thereto is then output.

In operation 530, the summation of the signal output in operation 510 and the signal output in operation 520 is up-sampled. The signals output in operations 510 and 520 correspond to an excitation signal down-sampled to w kHz by the encoder and thus the up-sampled summation signal is not the full spectrum signal for which the LPC coefficients were obtained.

In operation 540, a high frequency band signal corresponding to the high frequency portion of the full spectrum signal is generated from the up-sampled low frequency band signal produced in operations 510, 520 and 530. Also in operation 540, the high frequency band signal is adjusted using the power vector index corresponding to the energy value in each sub-band of the high frequency band output in operation 500.

In operation 550, full spectrum signal is provided to generate the voice spectral envelope using the LPC coefficients obtained in operation 500 and the reproduced speech is then output.

Figure 6:
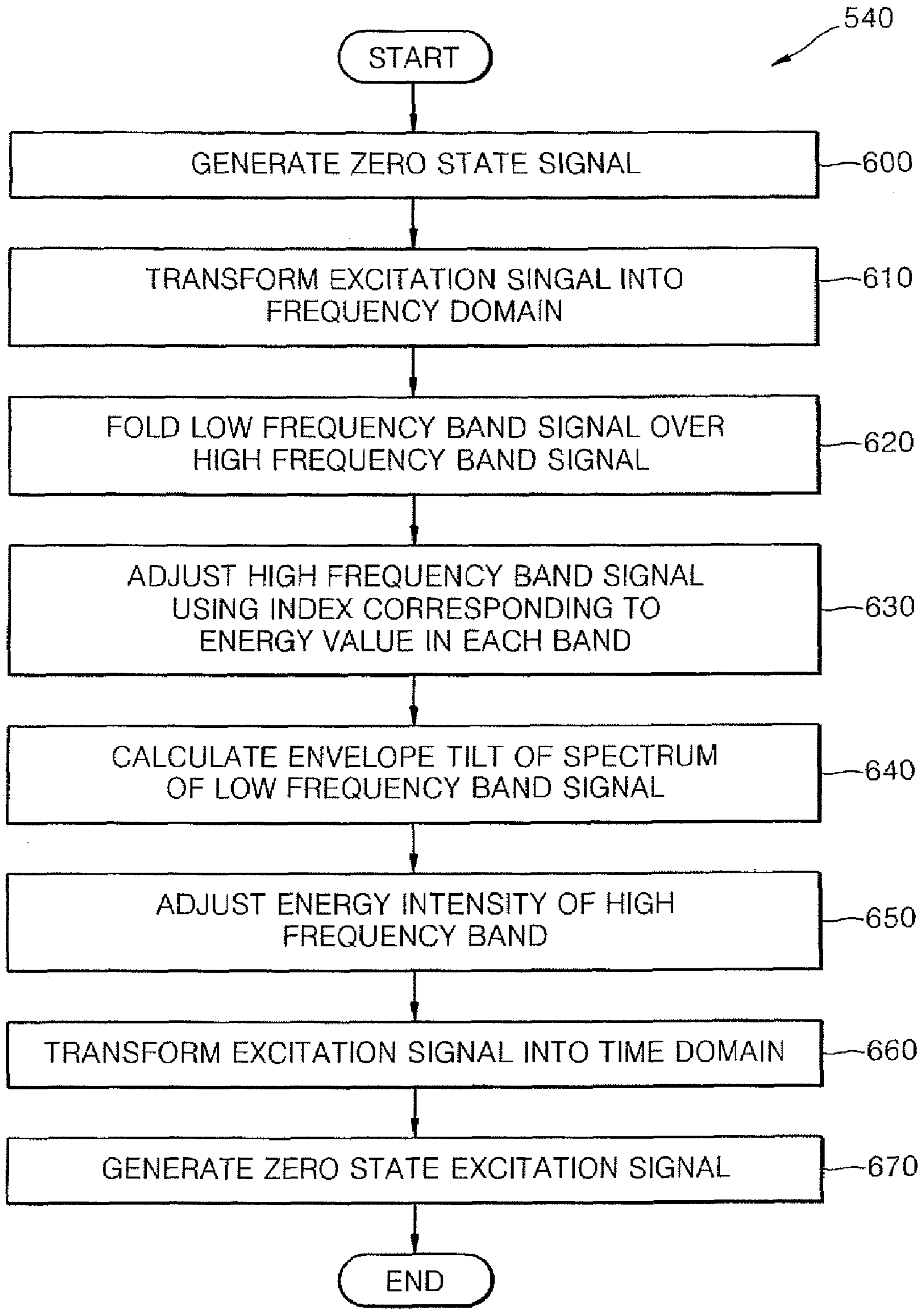
FIG. 6 is a flowchart illustrating operation 540 of the method illustrated in FIG. 5, according to an embodiment of the present general inventive concept.

FIG. 6 is a flowchart illustrating operation 540 of the method illustrated in FIG. 5, according to an embodiment of the present general inventive concept.

In operation 600, impulse response and convolution of an LPC synthesis filter are performed on the excitation signal up-sampled in operation 530 to generate a zero state signal.

In operation 610, the zero state signal generated in operation 600 is transformed into the frequency domain, such as, for example, through an FFT.

In operation 620, the spectrum of the low frequency band signal, which has been transformed into the frequency domain in operation 610, is symmetrically folded at a kHz into the high frequency band (where a denotes a frequency obtained through a division of w by "2") as illustrated in FIG. 8. Here, the low frequency spectral band signal is folded over into the high frequency band to produce a base high frequency band spectrum having excitation signal characteristics consistent with the original signal.

In operation 630, the high frequency band spectrum is adjusted as illustrated in FIG. 9 using the index corresponding to the energy value in each sub-band of the high frequency band output in operation 500. In other words, in operation 630, a spectral intensity of the frequencies in each band is adjusted using the energy value previously computed at the encoder for that band.

In operation 640, the spectral envelope tilt of the low frequency band is calculated.

In operation 650, the spectral intensity of the high frequency band is adjusted using the envelope tilt calculated in operation 640. In other words, in operation 650, the sub-bands of the high frequency band are adjusted using envelope tilt information of the low frequency band to ensure continuity of the frequency components of the low frequency band and the frequency components of the high frequency band.

In operation 660, the spectrum adjusted in operation 650 is transformed into a time domain signal.

In operation 670, the impulse response and convolution of the LPC synthesis filter are performed on the signal transformed into the time domain in operation 660 to generate the zero state excitation signal.

As described above, in wideband encoding and decoding according to the present general inventive concept, a linear prediction can be performed on an input signal, an energy value in each band of a high frequency band can be encoded, and the input signal is down-sampled to be encoded. Also, a high frequency band signal can be generated using a low frequency band signal, energy in each band can be adjusted using the encoded energy value in each band, and the spectral envelope can be synthesized and decoded using a linear prediction synthesis.

Thus, discontinuity can be prevented from occurring between the low and high frequency band signals. Also, a spectral envelope of an original can be maintained. As a result, a performance of a wideband speech codec can be implemented using minimum resources.

The present general inventive concept may also be embodied as computer readable processor instruction codes on a computer readable medium. The computer readable medium may be any medium that can be read by a computer system, such as a storage medium or a transmission medium. Examples of the computer readable storage medium include read-only memory (ROM), random-access memory (RAM), CD-ROMs, magnetic tapes, hard disks, floppy disks, flash memory, optical data storage devices, and so on. Examples of computer readable transmission medium include electromagnetic signals in a conductive cable, in a fiber optic fiber, in free-space, and so on.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A wideband decoding method comprising:

decoding an excitation signal;

up-sampling the decoded signal;

generating a high frequency band signal of the up-sampled signal using the decoded excitation signal; and decoding linear predictive coding (LPC) coefficients to LPC synthesize the decoded excitation signal with the generated high frequency band signal.

2. The wideband decoding method of claim 1, wherein the decoded signal is folded over a preset frequency of the up-sampled signal.

3. The wideband decoding method of claim 2, wherein the generating of the high frequency band signal of the up-sampled signal using the decoded excitation signal comprises:

folding the decoded signal over the preset frequency of the up-sampled signal; and decoding an energy value corresponding to each sub-band of the high frequency band of the up-sampled signal to adjust the folded signal therewith.

4. The wideband decoding method of claim 3, wherein the generating of the high frequency band signal of the up-sampled signal using the decoded excitation signal further comprises:

adjusting the high frequency band of the up-sampled signal using envelope information of a low frequency band.

5. The wideband decoding method of claim 1, wherein the excitation signal is decoded using a codebook index.

6. A computer-readable medium having embodied thereon processor instructions, which when executed by a processor, perform the wideband decoding method of claim 1.

7. A wideband decoding apparatus comprising:

an excitation signal decoder to decode an excitation signal;

an up-sampler to up-sample the decoded signal;

a high frequency band generator to generate a high frequency band signal of the up-sampled signal using the decoded excitation signal; and a synthesizer to decode LPC coefficients to LPC synthesize the decoded signal with the generated high frequency band signal.

8. The wideband decoding apparatus of claim 7, wherein the high frequency band generator folds the decoded signal over a preset frequency of the up-sampled signal.

9. The wideband decoding apparatus of claim 8, wherein the high frequency band generator comprises:

a folder to fold the decoded signal over the high frequency band of the up-sampled signal; and a high frequency band adjuster to decode an energy value corresponding to each sub-band of the high frequency band of the up-sampled signal to adjust the folded signal therewith.

10. The wideband decoding apparatus of claim 9, wherein the high frequency band generator further comprises:

an energy adjuster to adjust the high frequency band of the up-sampled signal using envelope information of a low frequency band.

11. The wideband decoding apparatus of claim 7, wherein the excitation signal decoder decodes the excitation signal using a codebook index.

12. A wideband decoding apparatus, comprising:

a high frequency band generator to generate a full spectrum excitation signal from a representation of a frequency band of an excitation signal below a preset frequency and energy values of the excitation signal above the preset frequency; and a linear prediction synthesizer to synthesize a wideband signal from the generated full spectrum excitation signal and linear prediction coefficients corresponding to a full spectrum excitation signal from which the representation thereof and the energy values thereof are derived.

* * * * *